United States Patent
Lee et al.

(10) Patent No.: US 10,900,119 B2
(45) Date of Patent: Jan. 26, 2021

(54) TUNGSTEN PRECURSOR AND METHOD OF FORMING TUNGSTEN CONTAINING LAYER USING THE SAME

(71) Applicant: Samsung Electronics Co., Ltd., Suwon-si (KR)

(72) Inventors: Soyoung Lee, Suwon-si (KR); Jaesoon Lim, Seoul (KR); Jieun Yun, Hwaseong-si (KR); Akio Saito, Tokyo (JP); Tsubasa Shiratori, Tokyo (JP); Yutaro Aoki, Tokyo (JP)

(73) Assignees: Samsung Electronics Co., Ltd., Gyeonggi-do (KR); Adeka Corporation, Tokyo (JP)

( * ) Notice: Subject to any disclaimer, the term of this patent is extended or adjusted under 35 U.S.C. 154(b) by 291 days.

(21) Appl. No.: 15/855,368

(22) Filed: Dec. 27, 2017

(65) Prior Publication Data
US 2018/0363131 A1   Dec. 20, 2018

(30) Foreign Application Priority Data
Jun. 15, 2017  (KR) .................. 10-2017-0076029

(51) Int. Cl.
*C23C 16/30* (2006.01)
*C07F 11/00* (2006.01)
(Continued)

(52) U.S. Cl.
CPC .............. *C23C 16/30* (2013.01); *C07F 11/00* (2013.01); *C23C 16/405* (2013.01); *C23C 16/45553* (2013.01)

(58) Field of Classification Search
None
See application file for complete search history.

(56) References Cited

U.S. PATENT DOCUMENTS

| 7,547,796 B2 | 6/2009 | Peters et al. |
| 7,754,908 B2 | 7/2010 | Reuter et al. |
| (Continued) | | |

FOREIGN PATENT DOCUMENTS

| JP | 2014-534952 A | 12/2014 |
| JP | 2015-221940 A | 12/2015 |
| (Continued) | | |

OTHER PUBLICATIONS

George ("Synthesis of Mono-Imido Tungsten Complexes Directly from WCl6" ChemistrySelect 2016, 1, 44-47) (Year: 2016).*

(Continued)

*Primary Examiner* — Joel G Horning
(74) *Attorney, Agent, or Firm* — Harness, Dickey & Pierce, P.L.C.

(57) ABSTRACT

Disclosed is a tungsten precursor and a method of forming a tungsten-containing layer. The tungsten precursor has a structure represented by Formula 1 below.

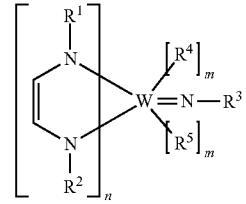

[Formula 1]

In Formula 1, $R^1$, $R^2$, and $R^3$ independently include a straight-chained or a branched alkyl group including a substituted or an unsubstituted C1-C5; $R^4$ and $R^5$ independently include a straight-chained or a branched alkyl group including a C1-C5, halogen element, dialkylamino group (Continued)

having C2-C10, or trialkylsilyl group including a C3-C12; n is 1 or 2, and m is 0 or 1. Also, n+m=2 (e.g., when n is 1, m is 1). When n is 2, m is 0 and each of $R^1$ and $R^2$ are provided in two. Two $R^1$s are independently of each other, and two $R^2$s are independently of each other.

20 Claims, 5 Drawing Sheets

(51) Int. Cl.
    *C23C 16/455*     (2006.01)
    *C23C 16/40*     (2006.01)

(56) References Cited

U.S. PATENT DOCUMENTS

| | | |
|---|---|---|
| 8,153,831 B2 | 4/2012 | Thompson et al. |
| 9,637,395 B2 | 5/2017 | Li et al. |
| 2014/0235054 A1 | 8/2014 | Lansalot-Matras et al. |
| 2015/0325475 A1 | 11/2015 | Bamnolker et al. |
| 2016/0032454 A1 | 2/2016 | Gatineau et al. |
| 2016/0122867 A1 | 5/2016 | Han et al. |

FOREIGN PATENT DOCUMENTS

| | | |
|---|---|---|
| KR | 10-2007-0073636 A | 7/2007 |
| KR | 10-2008-0061381 A | 7/2008 |
| KR | 10-1434696 B1 | 8/2014 |
| KR | 10-2014-0138084 A | 12/2014 |
| KR | 10-1546319 B1 | 8/2015 |
| KR | 2015-0126708 A | 11/2015 |
| KR | 10-1581314 B1 | 12/2015 |

OTHER PUBLICATIONS

Pierre, et al. "Synthesis and Study of Imidoalkyl Complexes of Tungsten (VI): Application of 14N NMR Spectroscopy" Organometallics, vol. 10, No. 5, pp. 1546-1550 (1991).

* cited by examiner

TUNGSTEN PRECURSOR AND METHOD OF FORMING TUNGSTEN CONTAINING LAYER USING THE SAME

CROSS-REFERENCE TO RELATED APPLICATIONS

This U.S. Non-provisional patent application claims priority under 35 U.S.C § 119 to Korean Patent Application No. 10-2017-0076029, filed on Jun. 15, 2017, the entire contents of which are hereby incorporated by reference.

BACKGROUND

Inventive concepts relate to a tungsten precursor and a method of forming a tungsten-containing layer using the same.

A semiconductor device is considered to be an important factor in electronic industry because of its small size, multi-function, and/or low fabrication cost. A semiconductor device may be highly integrated as the electronic industry develops. Line widths of patterns of a semiconductor device are being reduced for high integration thereof. Accordingly, resistance of electric lines is being increased. Tungsten, with low electric resistance, is used as a material of electric lines so as to reduce resistance of the electric lines. Tungsten is also used to form gate electrodes, masks, etc.

SUMMARY

Some example embodiments of inventive concepts provide a tungsten precursor that is suitable for deposition and limits and/or prevents deterioration of semiconductor devices.

Some example embodiments of inventive concepts provide a method of forming a tungsten-containing layer that limits and/or prevents deterioration of semiconductor devices.

According to some example embodiments of inventive concepts, a tungsten precursor may be expressed by the following Formula 1.

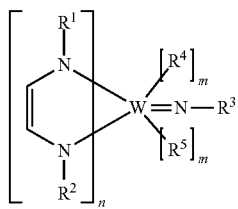

[Formula 1]

In Formula 1, $R^1$, $R^2$, and $R^3$ may independently include a straight-chained or a branched alkyl group including a substituted or unsubstituted C1-C5, $R^4$ and $R^5$ may be independently straight-chained or branched alkyl group including C1-C5, a halogen element, a dialkylamino group including C2-C10, or a trialkylsilyl group including C3-C12, n may be 1 or 2, and m may be 0 or 1. Also, n+m may satisfy the relationship: n+m=2. When n is 2, m may be 0 and each of $R^1$ and $R^2$ may be provided in two. Two $R^1$s may be independently of each other. Two $R^2$s may be independently of each other.

According to some example embodiments of inventive concepts, a method of forming a tungsten-containing layer may include providing a tungsten precursor on a substrate and the tungsten precursor may be expressed by the above Formula 1.

DETAILED DESCRIPTION

Figure 1:
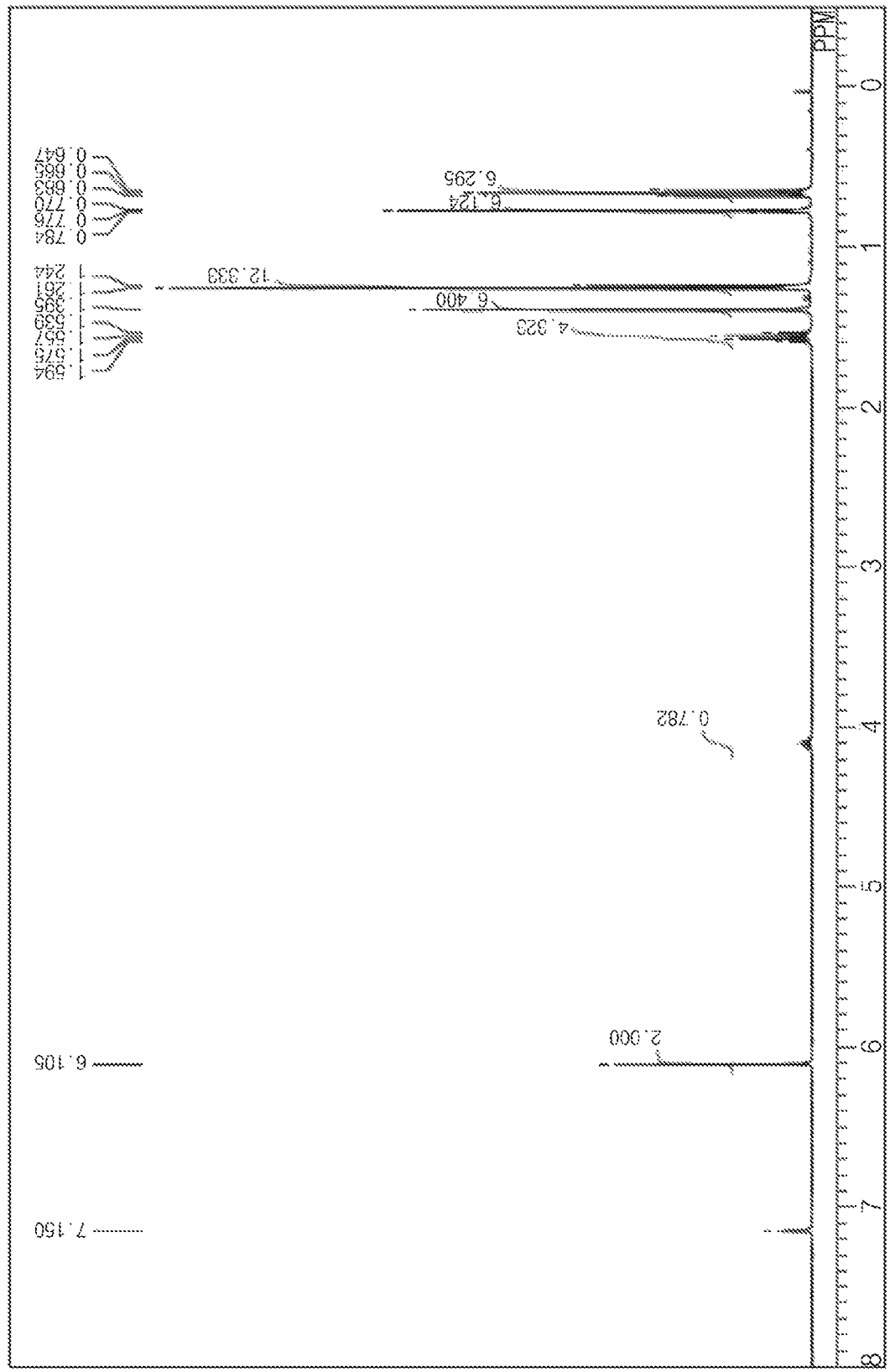
FIG. 1 illustrates proton nuclear magnetic resonance (1H-NMR) analysis data of tungsten precursor expressed by Formula (1-3) according to some example embodiments of inventive concepts.

Hereinafter, some example embodiments of inventive concepts will be described in detail in conjunction with the accompanying drawings to aid in clearly understanding inventive concepts. In this description, the suffix number attached to symbol of C may represent the number of carbon atoms. For example, the symbol of C1 may mean one carbon atom, and the symbol of C12 may mean twelve carbon atoms. When a hyphen is placed between two C with a suffix, the expression may provide a range. For example, the expression C1-C5 may denote one of the following groups: methyl, ethyl, propyl (and/or isopropyl), butyl (e.g., n-butyl, isobutyl), or a pentyl (e.g., n-pentyl, isopentyl, etc.). Throughout the description, a tertiary amyl group may also be called a tertiary pentyl group.

According to some embodiments of inventive concepts, a tungsten precursor may be expressed by the following Formula 1.

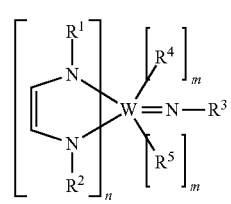

[Formula 1]

In Formula 1, $R^1$, $R^2$, and $R^3$ may independently include straight-chained (e.g., linear) or branched alkyl group having substituted or unsubstituted C1-C5; $R^4$ and $R^5$ may independently include straight-chained or branched alkyl group having substituted or unsubstituted C1-C5, halogen element, dialkylamino group having C2-C10, or trialkylsilyl group having C3-C12; n is 1 or 2; and m is 0 or 1. When n is 1, m may be 1. When n is 2, m may be 0 and each of $R^1$ and $R^2$ may be provided in two. Two $R^1$s may be independently of each other, and two $R^2$s may be independently of each other. When n is 2, two $R^1$s may be disposed at left and right sides across a tungsten atom, and likewise two $R^2$s may also be disposed at left and right sides across the tungsten atom. When n is 2, Formula 1 may correspond to one of the following specific Formulae (1-70) to (1-75).

The straight-chained or branched alkyl group having C1-C5 may include hydrogen atoms, at least one of which may be substituted by trialkylsilyl group having C3-C12. The straight-chained or branched alkyl group having C1-C5 may include one selected from a group consisting of methyl, ethyl, propyl, isopropyl, butyl, isobutyl, secondary butyl, tertiary butyl, pentyl, and isopentyl. The halogen element may include one of fluorine, chlorine, bromine, and iodine. The dialkylamino group having C2-C10 may include one selected from a group consisting of dimethylamino group, ethylmethylamino group, methylpropylamino group, methylisopropylamino group, diethylamino group, ethylpropylamino group, ethylisopropylamino group, diisopropylamino group, disecondarybutylamino group, and ditertiarybutylamino group. The trialkylsilyl group having C3-C12 may include trimethylsilyl group or triethylsilyl group.

When n is 1, each of $R^1$, $R^2$, and $R^3$ may independently include straight-chained or branched alkyl group having C3-C5, and $R^4$ and $R^5$ may independently include straight-chained alkyl group having C1-C5. When n is 1, each of $R^1$ and $R^2$ may independently include an isopropyl group, a tertiary amyl group, a tertiary butyl group or tertiary pentyl group; $R^3$ may include isopropyl group, an n-propyl group, a tertiary butyl group, or a tertiary pentyl group; and $R^4$ and $R^5$ may independently include a halogen, a methyl group or an ethyl group. When n is 1, $R^3$ may include an isopropyl group, and $R^4$ and $R^5$ may a include methyl group.

When n is 2, each of $R^1$, $R^2$, and $R^3$ may independently include straight-chained or branched alkyl group having C3-C5. Alternatively, when n is 2, each of $R^1$, $R^2$, and $R^3$ may independently include branched chain alkyl group having C3-C4. Dissimilarly, when n is 2, each of $R^1$, $R^2$, and $R^3$ may independently include isopropyl group, secondary butyl group, or tertiary butyl group, and in this case the tungsten precursor may have low melting point.

For example, the tungsten precursor may have one of chemical structures expressed by the following specific Formulae (1-1) to (1-75).

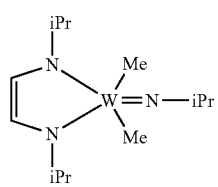

(1-1)

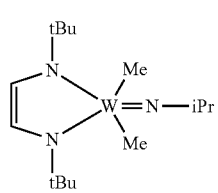

(1-2)

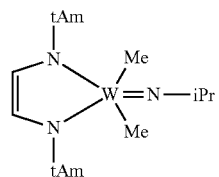

(1-3)

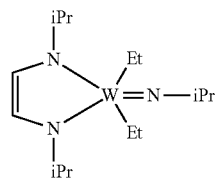

(1-4)

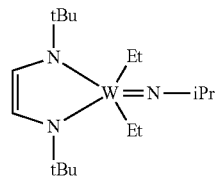

(1-5)

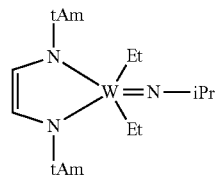

(1-6)

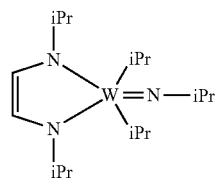

(1-7)

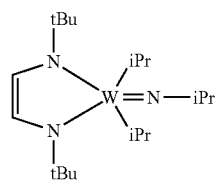

(1-8)

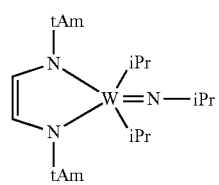

(1-9)

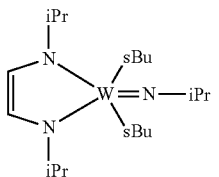

(1-10)

-continued
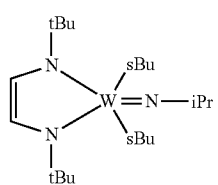 (1-11)
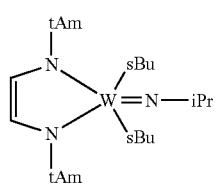 (1-12)
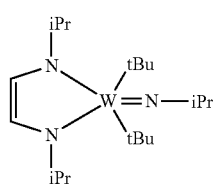 (1-13)
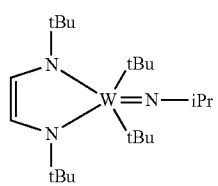 (1-14)
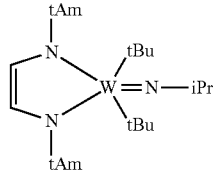 (1-15)
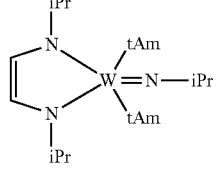 (1-16)
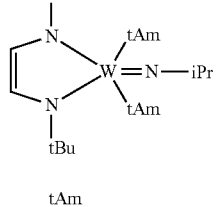 (1-17)
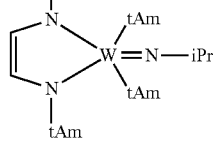 (1-18)
-continued
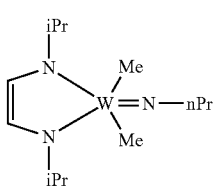 (1-19)
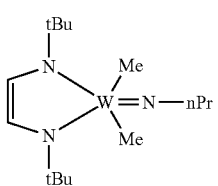 (1-20)
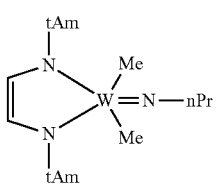 (1-21)
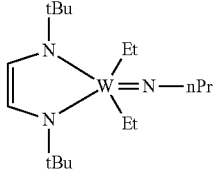 (1-22)
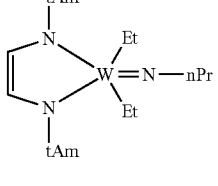 (1-23)
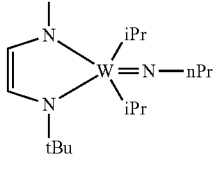 (1-24)
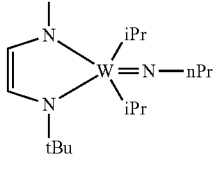 (1-25)
 (1-26)

-continued
(1-27)
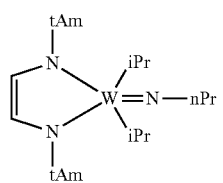
(1-28)
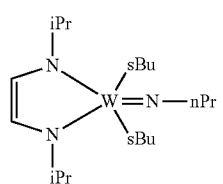
(1-29)
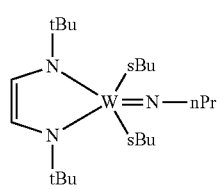
(1-30)
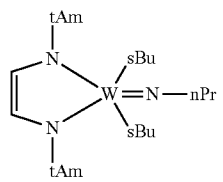
(1-31)
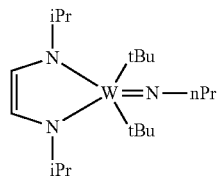
(1-32)
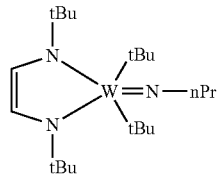
(1-33)
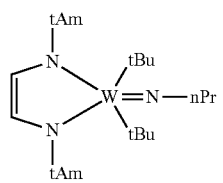
(1-34)
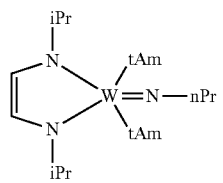
-continued
(1-35)
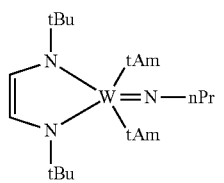
(1-36)
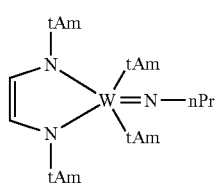
(1-37)
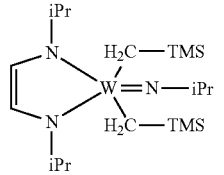
(1-38)
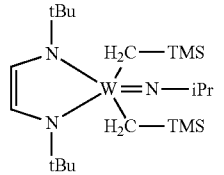
(1-39)
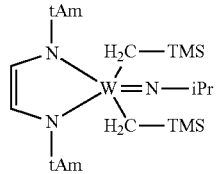
(1-40)
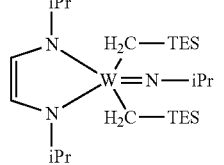
(1-41)
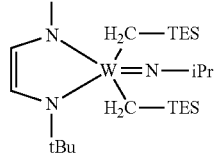
(1-42)
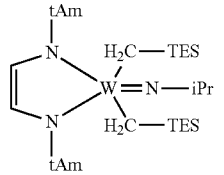

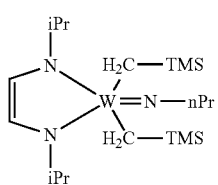
(1-43)
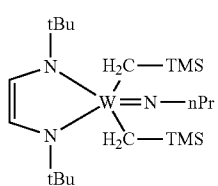
(1-44)
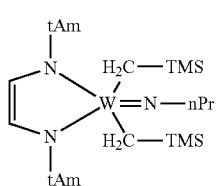
(1-45)
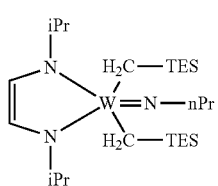
(1-46)
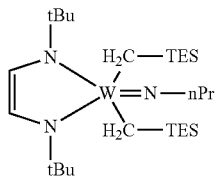
(1-47)
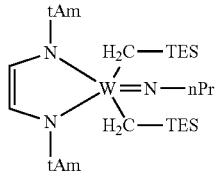
(1-48)
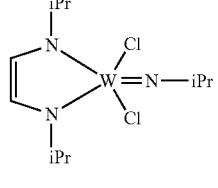
(1-49)
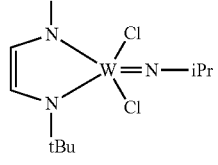
(1-50)
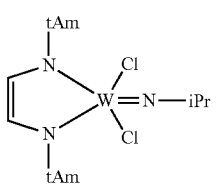
(1-51)
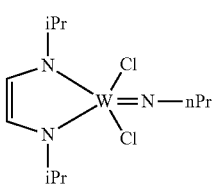
(1-52)
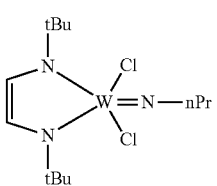
(1-53)
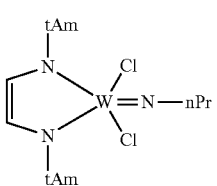
(1-54)
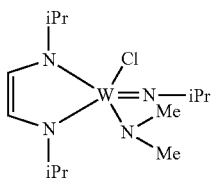
(1-55)
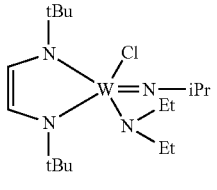
(1-56)
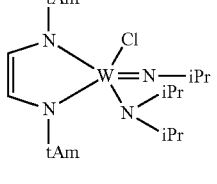
(1-57)
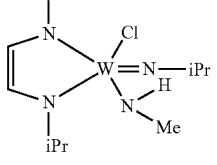
(1-58)

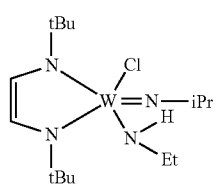 (1-59)
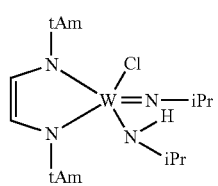 (1-60)
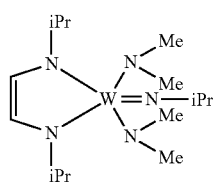 (1-61)
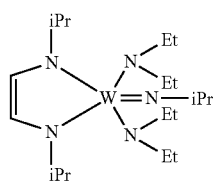 (1-62)
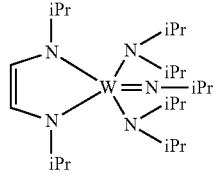 (1-63)
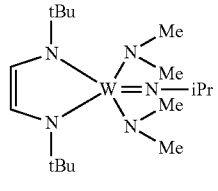 (1-64)
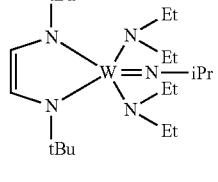 (1-65)
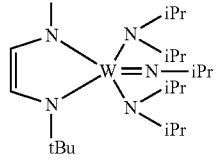 (1-66)
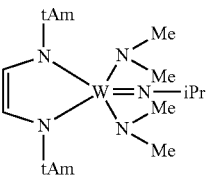 (1-67)
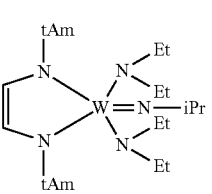 (1-68)
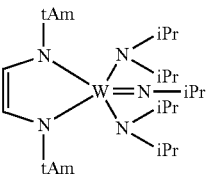 (1-69)
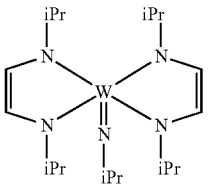 (1-70)
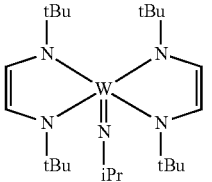 (1-71)
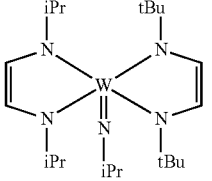 (1-72)
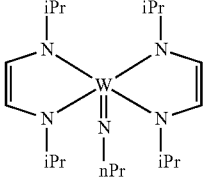 (1-73)
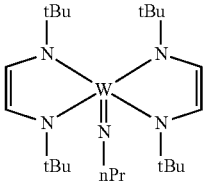 (1-74)

-continued

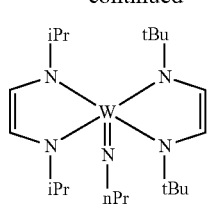

(1-75)

In the above specific Formulae (1-1) to (1-75), Me may represent methyl group, Et may represent ethyl group, nPr may represent n-propyl group, iPr may represent isopropyl group, nBu may represent n-butyl group, sBu may represent secondary butyl group, tBu may represent tertiary butyl group, tAm may represent tertiary amyl group, TMS may represent trimethylsilyl group, and TES may represent triethylsilyl group.

The following Reaction 1 may be utilized to form (or synthesize) the tungsten precursor without any particularly limitation.

[Reaction 1]

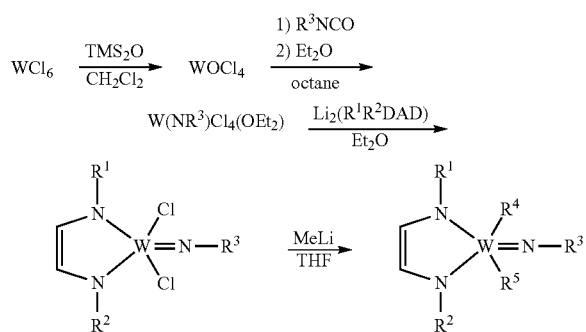

The following is a description about formation examples of specific compounds according to some example embodiments of inventive concepts.

Formation Example of Tungsten Precursor Expressed by Formula (1-3)

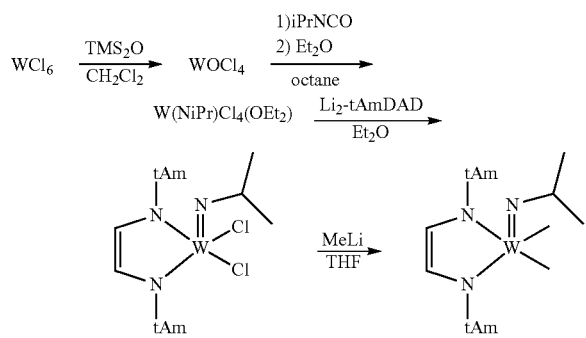

In the above reaction sequence for forming the tungsten precursor expressed by Formula (1-3), TMS may represent trimethylsilyl group, Et may represent ethyl group, iPr may represent isopropyl group, and DAD may represent diazadiene. Me may represent methyl group, and THF may represent tetrahydrofuran.

Tungsten oxyterachloride (WOCl$_4$) was synthesized from tungsten hexachloride (WCl$_6$). Synthesis and analysis of W(NiPr)Cl$_4$(OEt$_2$) from WOCl$_4$ was executed based on sequences reported by Jean Pierre Le Ny published in Organometallics (1991, Vol. 10, p. 1546). For example, under argon atmosphere, to a four-neck flask of 1 liter, WOCl$_4$ (40.0 g, 117 mol) and oxtane (570 ml) were added to produce a solution 1. After the solution 1 of 50 ml was dropwise added at room temperature, isopropyl isocyanate (15.9 g, 0.187 mol) was additionally dropwise added and then heated while being refluxed for about 16 hours. Thereafter, a solvent was removed under slightly reduced pressure to obtain a reddish brown solid substance. Diethylether (400 ml) was added and stirred for one hour at room temperature. The solvent was removed again under slightly reduced pressure to obtain an orange colored solid substance, or tetrachlroro(diethylether)(isopropylimide)tungsten [W(NiPr)Cl$_4$(OEt$_2$)] of 33.5 g (63% yield)

Figure 2:
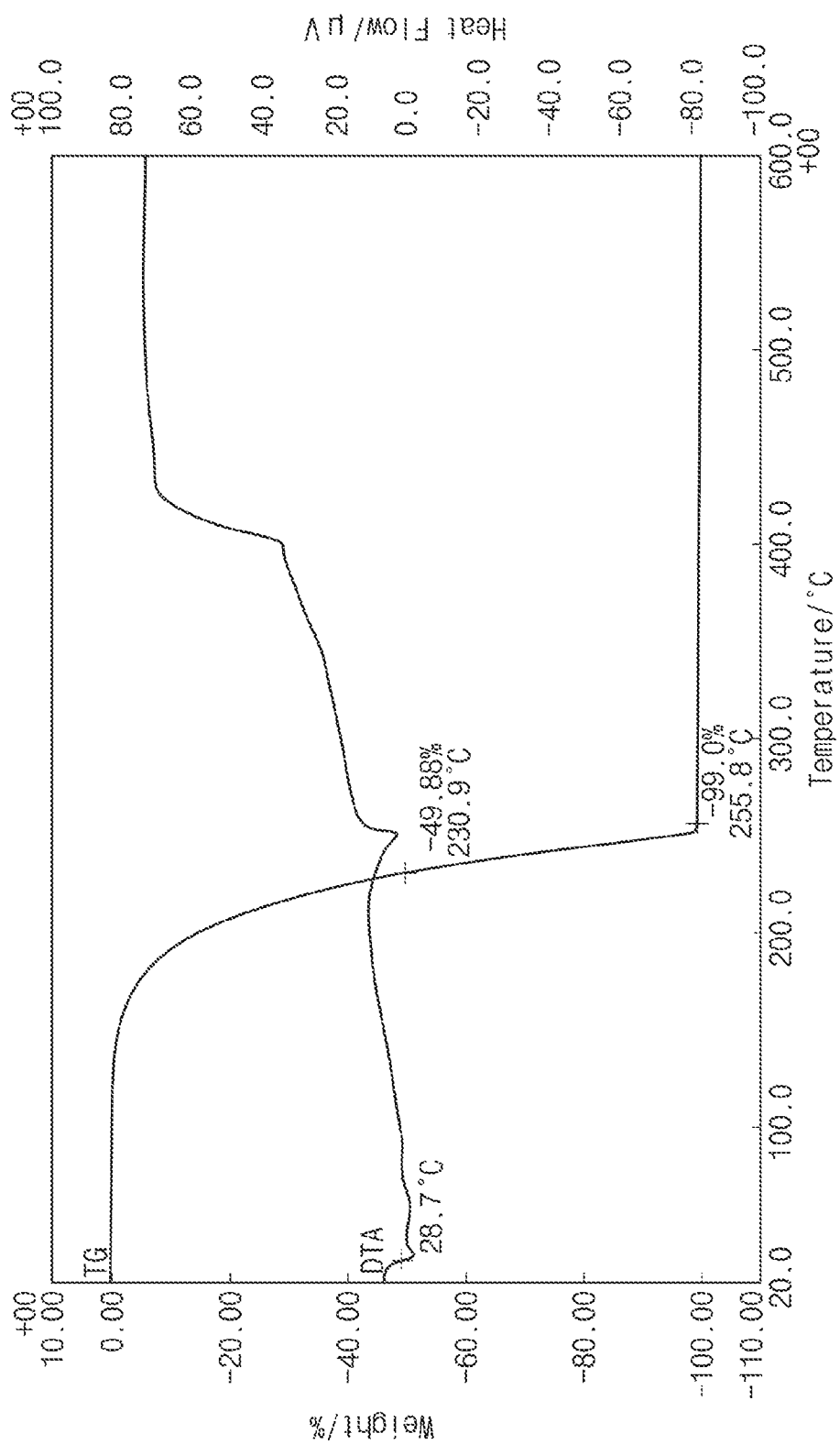
FIG. 2 illustrates a graph showing atmospheric pressure thermogravimetry and differential thermal analysis (TG-DTA) characteristics of tungsten precursor expressed by Formula (1-3) according to some example embodiments of inventive concepts.
Figure 3:
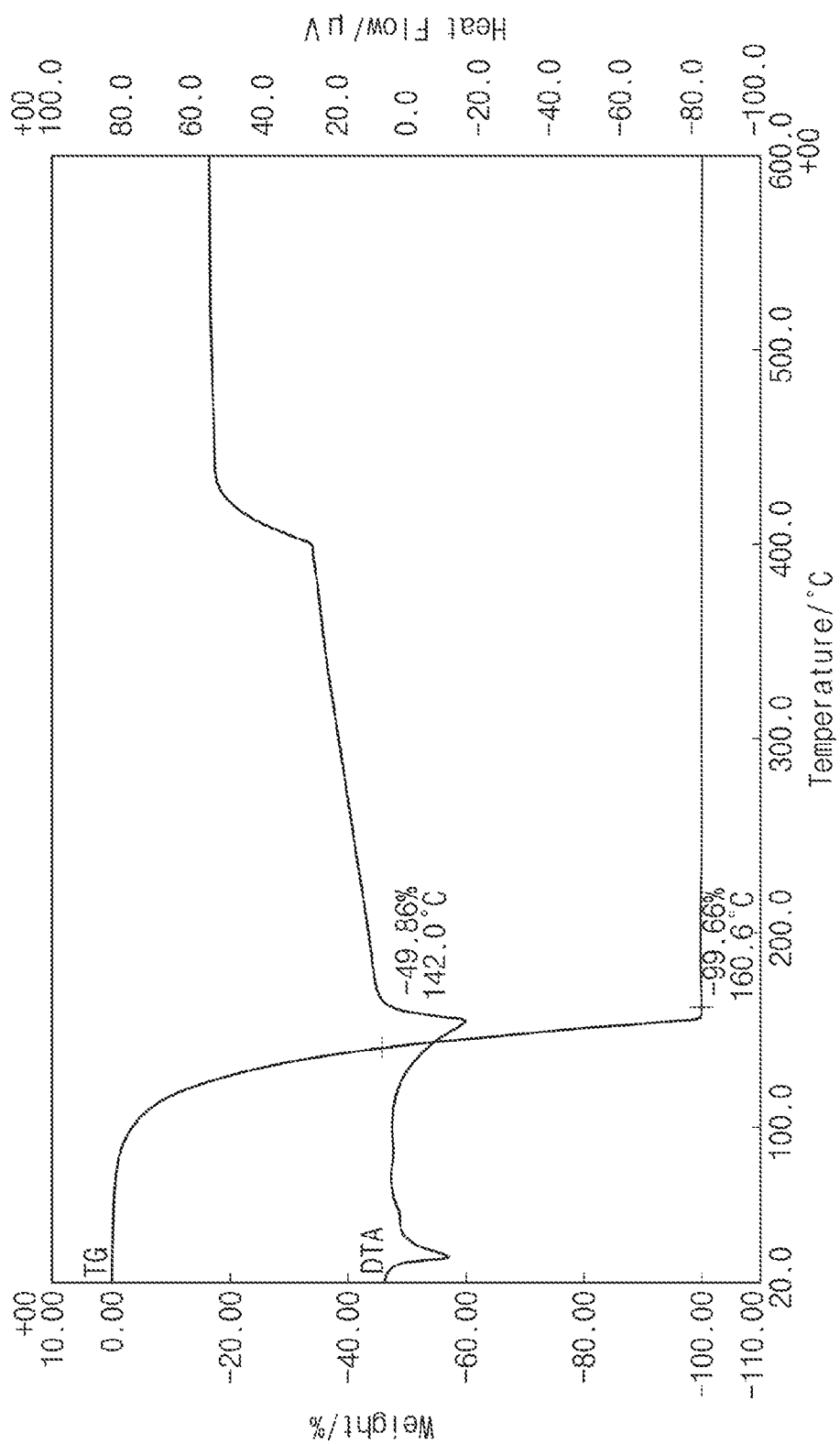
FIG. 3 illustrates a graph showing reduced pressure TG-DTA characteristics of tungsten precursor expressed by Formula (1-3) according to some example embodiments of inventive concepts.

Successively, under argon atmosphere, to a two-neck flask of 100 ml, tertiary-amyldiazadiene (4.52 g, 0.023 mol) and tetrahydrofuran (about 50 ml) was added and lithium (0.30 g, 0.0438 mol) was additionally added, and then a mixture thereof was stirred for overnight at room temperature to synthesize a diazadiene complex. After that, to a four-neck flask of 200 ml, the synthesized tetrachlroro(diethylether) (isopropylimide)tungsten [W(NiPr)Cl$_4$(OEt$_2$)] (10.0 g 0.0219 mol) and diethylether (about 80 ml) ware added, and then a mixture thereof was cooled down to −55° C. The diazadiene complex was dropwise added to the mixture, and thereafter the mixture was heated up to room temperature and stirred for overnight at room temperature. After that, a solvent was distilled under slight reduced pressure to obtain a black solid substance. The black solid substance was heated up to a bath temperature of 170° C. under reduced pressure (15 Pa) to synthesize (tertiary-amyldiazadiene) (dichloro)(isopropylimide)tungsten (referred to hereinafter an intermediate A). Under argon atmosphere, to a four-neck flask of 200 ml, the intermediate A (20.21 g, 0.0398 mol) and THF (about 90 ml) were added and then cooled down to −55° C. A dropping funnel was used to dropwise add metal lithium of 100 ml (1.17 M, 68 ml, 0.0796 mol), and thereafter a mixture thereof was heated up to room temperature and stirred for overnight at room temperature. A solvent was distilled under slightly reduced pressure to obtain a blackish brown solid substance. The blackish brown solid substance was extracted and filtered by hexane, and then distilled again under slightly reduced pressure to thereby obtain a reddish brown solid substance. The reddish brown solid substance was distilled at a bath temperature of 150° C. under slightly reduced pressure (15 pa) to obtain a reddish solid substance of 15.84 g (85% yield), or the tungsten precursor expressed by Formula (1-3). FIG. 1 illustrates 1H-NMR analysis data of the tungsten precursor expressed by Formula (1-3) according to some example embodiments of inventive concepts. FIG. 2 illustrates a graph showing atmospheric pressure TG-DTA characteristics of the tungsten precursor expressed by Formula (1-3) according to some example embodiments of inventive concepts. FIG. 3 illustrates a graph showing reduced pressure TG-DTA characteristics of the tungsten precursor expressed by Formula (1-3) according to some example embodiments of inventive concepts. A result of physical property analysis was as follows.

(1) 1H-NMR (benzene-d6) (chemical shift: multiplicity: the number of H) (0.67: t: 6)(0.78: s: 6)(1.25: d: 6)(1.26: s: 6)(1.40: s: 6)(1.55-1.58: m: 4)(4.11: sep: 1)(6.11: s: 2)

(2) Element Analysis (metal analysis: ICP-AES) W: 39.2 wt %, C: 43.7 wt %, H: 8.1 wt %, N: 9.0 wt % (theoretical value; W: 39.34 wt %, C: 43.69 wt %, H: 7.98 wt %, N: 8.99 wt %)

(3) Atmospheric pressure TG-DTA Mass 50% reduction temperature: 231° C. (Ar flow rate: 100 ml/min, temperature rise rate: 10° C./min)

(4) Reduced pressure TG-DTA Mass 50% reduction temperature: 142° C. (10 Torr, Ar flow rate: 50 ml/min, temperature rise rate: 10° C./min)

Formation Example of Tungsten Precursor Expressed by Formula (1-38)

Figure 4:
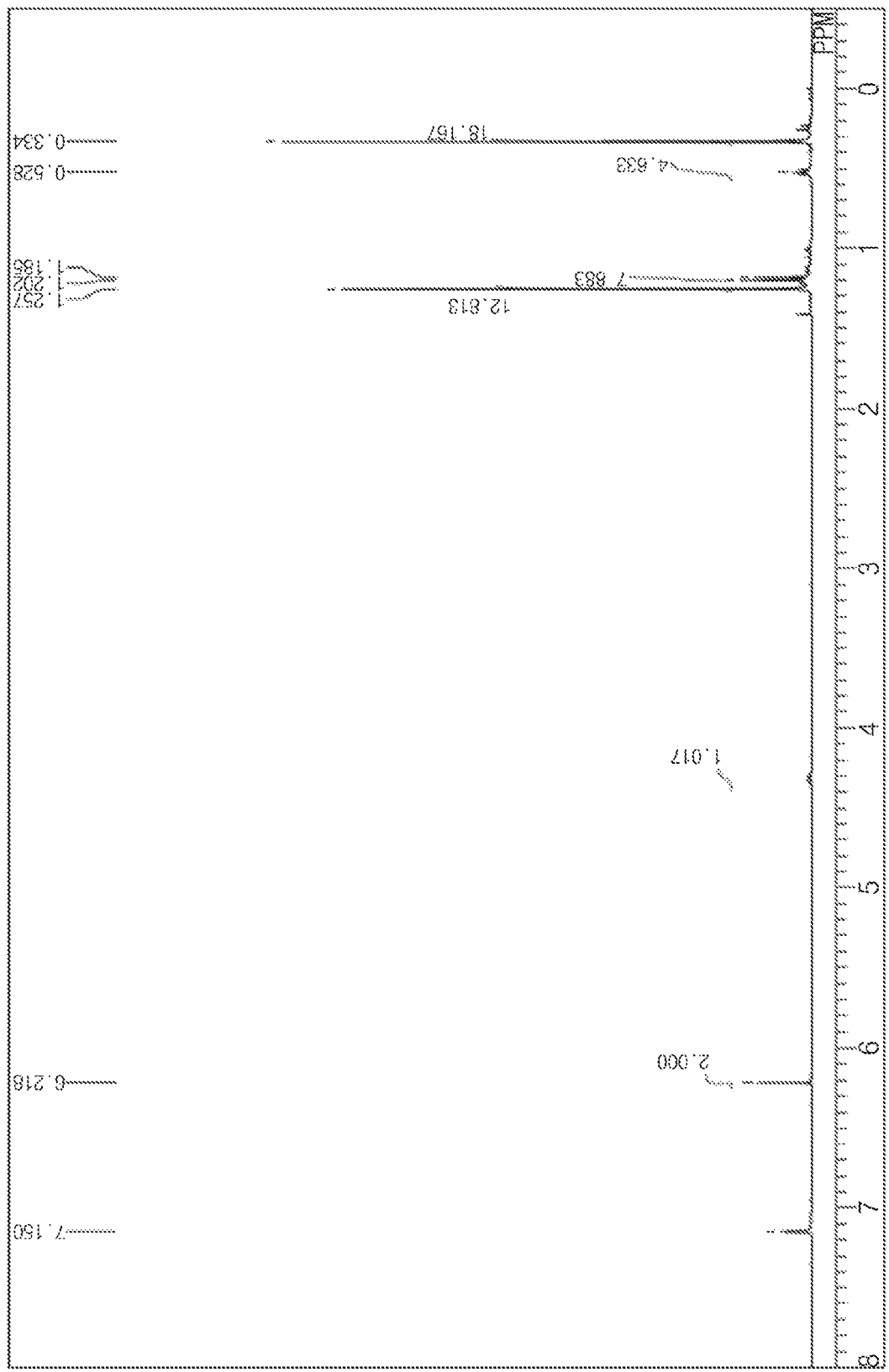
FIG. 4 illustrates 1H-NMR analysis data of tungsten precursor expressed by Formula (1-38) according to some example embodiments of inventive concepts.

Under argon atmosphere, to a four-neck flask of 200 ml, tertiarybutyldiazadiene (7.75 g, 0.0461 mol) and THF (about 80 ml) were added, and lithium (0.61 g, 0.0876 mol) was additionally added and then stirred for overnight at room temperature, thereby synthesizing a diazadiene complex. Successively, a four-neck flask of 300 ml was added thereto with diethylether (about 130 ml) and tetrachloro(diethylether)(isopropylimide)tungsten (20.01 g, 0.0438 mol) synthesized as discussed in the formation example of the tungsten precursor expressed by Formula (1-3), and then a mixture thereof cooled down to −55° C. The diazadiene complex was dropwise added to the mixture, and the mixture was heated up to room temperature and stirred for overnight at room temperature. After that, a solvent was distilled under slightly reduced pressure to obtain a brown solid substance. The brown solid substance was heated up to a bath temperature 190° C. under reduced pressure (20 Pa) to synthesize an intermediate B. Under argon atmosphere, to a four-neck flask of 200 ml, the intermediate B (6.00 g, 0.0125 mol) and THF (about 40 ml) were added, and then cooled down to −55° C. A dropping funnel was used to dropwise add (trimethylsilyl)methyllithium of 100 ml (1.0 M, 25 ml, 0.0250 mol), and a mixture thereof was heated up to room temperature and stirred for overnight at room temperature. Under slightly reduced pressure, a solvent was distilled to obtain a blackish brown solid substance. The blackish brown solid substance was extracted and filtered by hexane and then distilled again under slightly reduced pressure to thereby obtain a reddish brown solid substance. The reddish brown solid substance was distilled at a bath temperature of 140° C. under slightly reduced pressure (20 Pa) to obtain a reddish solid substance of 3.45 g (47% yield), or the tungsten precursor expressed by Formula (1-38). FIG. 4 illustrates 1H-NMR analysis data of the tungsten precursor expressed by chemical Formula (1-38) according to some example embodiments of inventive concepts. A result of physical property analysis was as follows.

(1) 1H NMR (benzene-d6) (chemical shift: multiplicity: the number of H) (0.33: s: 18)(0.51-0.54:m: 4)(1.20: d: 6)(1.26: s: 18)(4.32: sep: 1)(6.22: s: 2)

(2) Element Analysis (metal analysis: ICP-AES) W: 31.6 wt %, C:43.1 wt %, H: 8.3 wt %, N: 7.3 wt %, Si: 9.7 wt % (theoretical value; W: 31.5 wt %, C: 43.22 wt %, H: 8.46 wt %, N: 7.20 wt %, Si: 9.62 wt %)

(3) Atmospheric pressure TG-DTA Mass 50% reduction temperature: 251° C. (Ar flow rate: 100 ml/min, temperature rise rate: 10° C./min)

(4) Reduced pressure TG-DTA Mass 50% reduction temperature: 168° C. (10 Torr, Ar flow rate: 50 ml/min, temperature rise rate: 10° C./min)

Formation Example of Tungsten Precursor Expressed by Formula (1-64)

Figure 5:
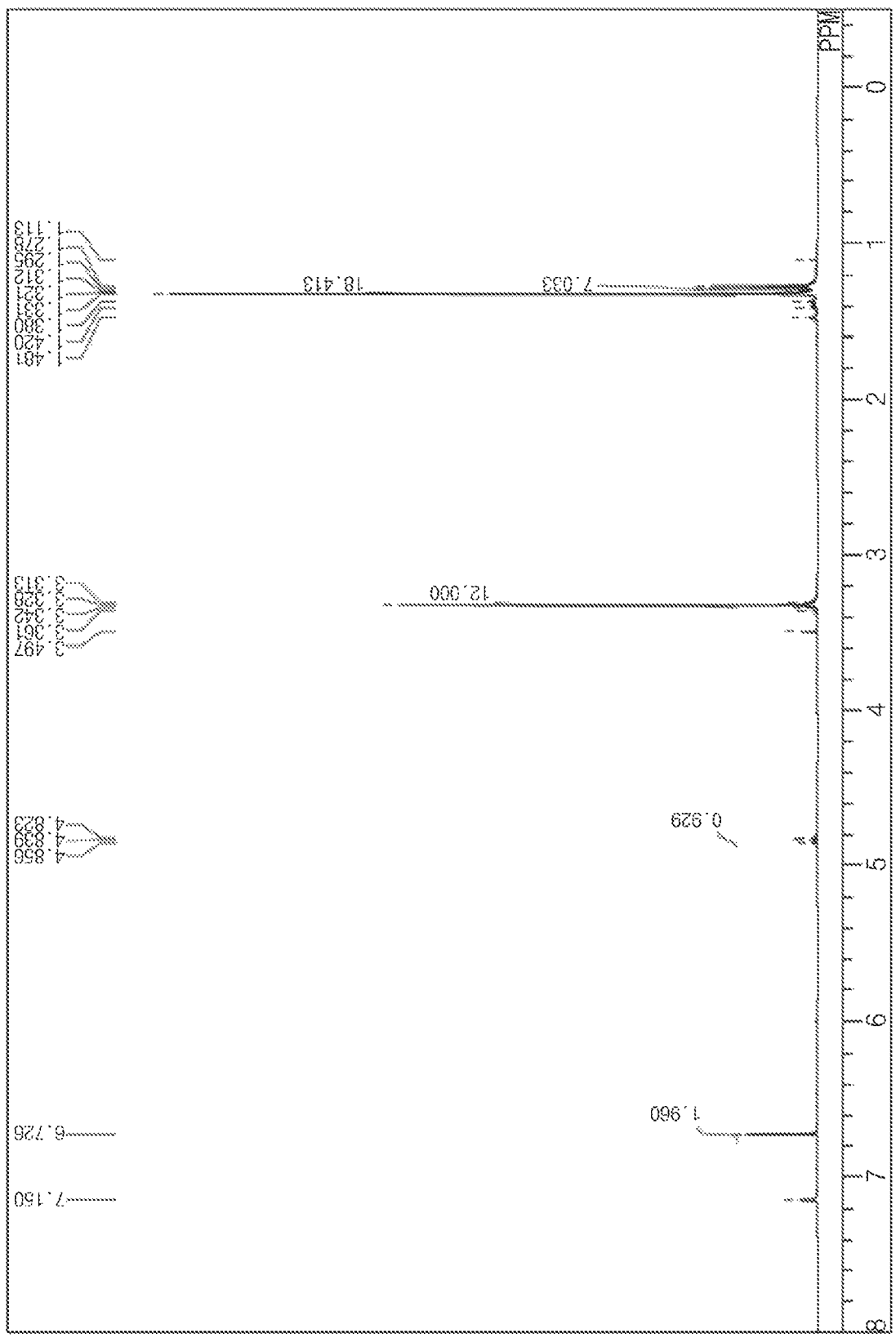
FIG. 5 illustrates 1H-NMR analysis data of tungsten precursor expressed by Formula (1-64) according to some example embodiments of inventive concepts.

Under argon atmosphere, a four-neck flask of 200 ml was added thereto with diethylether (about 70 ml) and cooled down to −30° C., and then dimethylamine gas (about 5 g, about 0.11 mol) was introduced to the flask. After a dropping funnel was used to dropwise add normal-butyl lithium of 100 ml (1.63 M, 18 ml, 0.0292 mol), a mixture thereof was heated up to room temperature and stirred for three hours at room temperature, thereby producing a lithium dimethylamide solution. Successively, under argon atmosphere, a four-neck flask of 300 ml was added thereto with THF (about 50 ml) and an intermediate B (7.03 g, 0.0146 mol) synthesized as discussed in the formation example of tungsten precursor expressed by Formula (1-38), and then cooled down to −55° C. A lithium dimethylamide solution was dropwise added using a cannular and then heated up to room temperature. A mixture was left stirred for overnight at room temperature to distill a solvent under slightly reduced pressure, thereby obtaining a blackish brown solid substance. The blackish brown solid substance was extracted and filtered by hexane and then distilled again under slightly reduced pressure to obtain a viscous reddish brown solid substance. The reddish brown solid substance was distilled at a bath temperature of 140° C. under reduced pressure (40 Pa) to obtain a viscous reddish liquid substance of 2.47 g (34% yield), or the tungsten precursor expressed by Formula (1-64). FIG. 5 illustrates 1H-NMR analysis data of the tungsten precursor expressed by chemical Formula (1-64) according to some example embodiments of inventive concepts. A result of physical property analysis was as follows.

(1) 1H NMR (benzene-d6) (chemical shift: multiplicity: the number of H) (1.29: d:6)(1.33: s: 18)(3.33: s: 12)(4.84: sep: 1)(6.73: s: 2)

(2) Element Analysis (metal analysis: ICP-AES) W: 37.1 wt %, C: 40.8 wt %, H: 7.8 wt %, N: 14.3 wt % (theoretical value; W: 36.96 wt %, C: 41.05 wt %, H: 7.90 wt %, N: 14.08 wt %)

(3) Atmospheric pressure TG-DTA Mass 50% reduction temperature: 219° C. (Ar flow rate: 100 ml/min, temperature rise rate: 10° C./min)

(4) Reduced pressure TG-DTA Mass 50% reduction temperature: 144° C. (10 Torr, Ar flow rate: 50 ml/min, temperature rise rate: 10° C./min)

Formation Example of Tungsten Precursor Expressed by Formula (1-72)

Under argon atmosphere, to a two-neck flask of 100 ml, isopropyldiazadiene (1.53 g, 0.0109 mol) and THF (about 30 ml) were added, and lithium (0.14 g, 0.0208 mol) was additionally added and then stirred for overnight at room temperature, thereby synthesizing a diazadiene complex. Successively, under argon atmosphere, a four-neck flask of 200 ml was added thereto with THF (about 30 ml) and an intermediate B (5.03 g, 0.0105 mol) synthesized as discussed in the formation example of tungsten precursor expressed by Formula (1-38), and then cooled down to −55° C. The diazadiene complex was dropwise added to the mixture, and the mixture was heated up to room temperature and stirred for overnight at room temperature. Under slightly reduced pressure, a solvent was distilled to obtain a blackish green solid substance. The blackish green solid substance was extracted and filtered by hexane and then distilled again under slightly reduced pressure to thereby obtain a blackish green solid substance. The blackish green solid substance was distilled at a bath temperature of 150° C. under slightly reduced pressure (15 Pa) to obtain a blackish green solid substance, or the tungsten precursor expressed by Formula (1-72). A result of physical property analysis of the tungsten precursor expressed by chemical Formula (1-72) was as follows.

(1) 1H NMR (benzene-d6) (chemical shift: multiplicity: the number of H) (1.27: d: 12)(1.29: s: 18)(1.33: br s: 6)(4.59: sep: 1)(4.65: sep: 1)(4.65: sep: 2)(6.51: s: 2)(6.58: s: 2)

(2) Element Analysis (metal analysis: ICP-AES) W: 33.7 wt %, C: 46.3 wt %, H: 7.6 wt %, N: 12.4 wt % (theoretical value; W: 33.46 wt %, C: 45.91 wt %, H: 7.89 wt %, N: 12.75 wt %)

(3) Atmospheric pressure TG-DTA Mass 50% reduction temperature: 242° C. (Ar flow rate: 100 ml/min, temperature rise rate: 10° C./min)

(4) Reduced pressure TG-DTA Mass 50% reduction temperature: 158° C. (10 Torr, Ar flow rate: 50 ml/min, temperature rise rate: 10° C./min)

Evaluation Experiment 1 of Tungsten Precursors: Melting Point

A measurement was taken to determine melting points of the tungsten precursors having chemical structures represented by Formulae (1-3), (1-38), and (1-64) formed as discussed above and a comparative tungsten precursor, or tungsten hexachloride ($WCl_6$). The experiment was carried out at 30° C. under atmospheric pressure, and Table 1 below shows measured results, or melting points of the tungsten precursors whose solid states are maintained at 30° C.

TABLE 1

| | Tungsten precursor expressed by Formula (1-3) | Tungsten precursor expressed by Formula (1-38) | Tungsten precursor expressed by Formula (1-64) | $WCl_6$ |
|---|---|---|---|---|
| Melting Point | Liquid at 30° C. | 71° C. | Liquid at 30° C. | 275° C. |

From the results in Table 1, the tungsten precursors having chemical structures expressed by Formulae (1-3), (1-39), and (1-64) may be in the liquid state at 30° C. under atmospheric pressure, or may be brought into the liquid state when being slightly heated up, e.g., to 71° C., and may be recognized to have a melting point much less than that of the comparative tungsten precursor, tungsten hexachloride ($WCl_6$). A high-melting point compound may require high supply energy for a deposition process such as chemical vapor deposition (CVD) or atomic layer deposition (ALD), thereby being inappropriate for the deposition process. When a transport tank delivers a solid compound at room temperature under atmospheric pressure, the sold compound may collide with a wall of the transport tank, and as a result, may have on its surface damages that enable to induce a difference in vapor pressure when the solid compound is evaporated. This tendency may cause difficulty in maintaining a stable process condition. The tungsten precursors of inventive concepts may have a relatively low melting point to require low energy in the deposition process, and may be safely delivered in its liquid state to maintain a stable process condition. As discussed above, the tungsten precursors of inventive concepts may be suitable for the deposition process such as CVD or ALD.

Evaluation Experiment 2 of Tungsten Precursors: Evaporation Rate

A TG-DTA measurement apparatus was used to heat the tungsten precursors having chemical structures expressed by Formulae (1-2), (1-3), (1-17), and (1-72) under the condition of a pressure of 760 Torr, a temperature ranging from room temperature to 600° C., an argon flow rate of 100 ml/min, and a temperature rise rate of 10° C./min. Table 2 below shows evaporation rates calculated by measuring quantities of obtained residues.

TABLE 2

| | Tungsten Precursor expressed by Formula (1-2) | Tungsten precursor expressed by Formula (1-3) | Tungsten precursor expressed by Formula (1-17) | Tungsten precursor expressed by Formula (1-72) |
|---|---|---|---|---|
| Evaporation rate | 99.6% | 99% | 98.5% | 97.5% |

From the results of Table 2, the tungsten precursors having chemical structures expressed by Formulae (1-2), (1-3), (1-17), and (1-72) may have a high evaporation rate greater than 97.5%. According to some example embodiments of inventive concepts, it is acknowledged that the tungsten precursors may evaporate extremely well, and residues may be insignificantly produced. When the evaporation rate becomes decreased, the residues resulting from heating may be produced in a great quantity.

It will be hereinafter described a method of forming a tungsten-containing layer using the tungsten precursor according to some example embodiments of inventive concepts.

The tungsten precursor expressed by Formula 1 may be supplied to form a tungsten-containing layer in a deposition process such as thermal CVD, PE (Plasma Enhanced) CVD, photo CVD, photoplasma CVD, ALD, or PEALD. In the thermal CVD, heat is used to react and deposit CVD materials on a substrate. In the PECVD, heat and plasma may be used to react CVD materials. In the photo CVD, heat and light may be used to react CVD materials. In the photoplasma CVD, heat, light, and plasma may be used to react CVD materials.

For example, when CVD is employed to form the tungsten-containing layer, the CVD material may be supplied by the following method including a gas transportation method and a liquid transportation method. In the gas transportation method, the CVD material may be evaporated by heating or depressurization in a container for storing the CVD material, and the evaporated CVD material may be introduced into a CVD deposition chamber. When the evaporated CVD material may be introduced along with a carrier gas such as nitrogen and/or helium. In the liquid transportation method, the CVD material in the liquid or solution state may be transported to an evaporation chamber where the transported CVD material is heated and depressurized to an evaporated state, and then the CVD deposition chamber may receive therein the evaporated CVD material. The gas and liquid transportation methods may be used to supply the tungsten precursor itself expressed by Formula 1. When the liquid transportation method is employed, the tungsten precursor may be dissolved in (or mixed with) a solvent to produce a solution, and then the tungsten precursor solution may be supplied. The CVD materials may also include other precursor or a nucleophile.

When the tungsten-containing layer includes only tungsten among metal atoms, only the tungsten precursor may be used as a CVD material according to some example embodiments of inventive concepts. When the tungsten-containing layer further includes nitrogen, oxygen, silicon, and/or other metal, the CVD material according to some example embodiments of inventive concepts may further include one or more of a reactive compound fitted thereto, other precursor, and a nucleophile for contributing precursor stability. In the above multi-component CVD process, the CVD materials may be supplied by a single-source method, in which each component of the CVD materials is independently evaporated, and a cocktail-source method, in which the CVD materials are in advance mixed in a desired constitution and then evaporated. Even if the cocktail-source method is employed, the CVD materials may be dissolved in an organic solvent to produce a solution, and the CVD material solution may be supplied.

The organic solvent is not limited to any particular substance and may include, for example, one or more of acetic acid esters, such as ethyl acetate, butyl acetate, and ethoxyethyl acetate; ethers, such as tetrahydrofuran, tetrahydropyran, ethyleneglycoldimethylether, diethyleneglycoldimethylether, triethyleneglycoldimethylether, dibutylether, and dioxane; ketones, such as methylbutylketone, methylisobutylketone, ethylbutylketone, dipropylketone, diisobutylketone, methylamylketone, cyclohexanone, and methylcyclohexanone; hydrocarbons, such as hexane, cyclohexane, methylcyclohexane, dimethycyclohexane, ethylcyclohexane, heptane, octane, toluene, and xylene; cyano group-containing hydrocarbons, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine; and lutidine. In a solution including the CVD material(s) and the organic solvent, the CVD material(s) may have an amount ranging either from 0.01 to 2.0 mol/l or from 0.05 to 1.0 mol/l. When the CVD material includes only the tungsten precursor of inventive concepts, the amount range may refer to an amount of only the tungsten precursor. When the CVD material includes other precursors as well as the tungsten precursor of inventive concepts, the amount range may correspond to a sum total amount of the other precursors and the tungsten precursor of inventive concepts.

The other precursor may include silicon compound and/or metal compound each having a ligand that includes one or more of hydrate, hydroxide, halide, azide, alkyl, alkenyl, cycloalkyl, aryl, alkynyl, amino, dialkylaminoalkyl, mono (alkyl)amino, dialkylamino, diamine, di(silylalkyl)amino, di(alkylsilyl)amino, disilylamino, alkoxy, alkoxyalkyl, hydrazide, phosphide, nitrile, dialkylaminoalkoxy, alkoxyalkyldialkylamino, silcoxy, diketonate, cyclopentadienyl, silyl, pyrazolate, guanidinate, phosphorguanidinate, amidinate, phosphoramidinate, ketoiminate, diketiminate, carbonyl, and phosphoramidinate. The metal may include one of magnesium, calcium, strontium, barium, radium, scandium, yttrium, titanium, zirconium, hafnium, niobium, tantalum, chrome, molybdenum, tungsten, manganese, iron, osmium, cobalt, rhodium, iridium, nickel, palladium, platinum, copper, silver, gold, zinc, cadmium, aluminum, gallium, indium, germanium, tin, lead, antimony, bismuth, lanthanum, cerium, praseodymium, neodymium, promethium, samarium, europium, gadolinium, terbium, dysprosium, holmium, erbium, thulium, and ytterbium.

The other precursor is not limited to any particular manufacturing method. For example, when an alcohol compound is used as an organic ligand, a precursor may be produced by reaction between alkali metal alkoxide of the alcohol compound and either inorganic acid of metal or hydrate of metal. In this case, the inorganic acid of metal or hydrate of metal may include halide or nitrate of the metal, and the alkali metal alkoxide may include one or more of sodium alkoxide, lithium alkoxide, and potassium alkoxide.

When the single-source method is employed to supply the CVD material of inventive concepts, it may be appropriate that the other precursor includes a compound whose characteristics are similar to thermal or oxidation/decomposition characteristics of the tungsten precursor of inventive concepts. When the cocktail-source method is employed to supply the CVD material of inventive concepts, it may be appropriate that the other precursor includes a compound that does not undergo alteration resulting from chemical reaction at the mixing time as well as having characteristics similar to thermal or oxidation/decomposition characteristics of the tungsten precursor of inventive concepts.

The nucleophile may be added to impart stability to the tungsten precursor of inventive concepts and to the other precursors. The nucleophile may include at least one selected from a group consisting of ethylene glycol ethers, such as glyme, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,17,10,10-hexamethyltriethylenetetramine, and triethoxytriethyleneamine; cyclicpolyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-keto esters, such as methyl acetoacetate, ethyl acetoacetate, and acetoacetic acid-2-methoxyethyl; β-diketones, such as acetylacetone, 2,4-hexanedione, 2,4-heptadione, 3,5-heptadione, and dipivaloylmethane. When a total amount of the precursors is 1 mol, a used amount of the nucleophile may be in a range from 0.1 to 10 mol or from 1 to 4 mol.

It may be desired that a deposition material of inventive concepts include no residues such as metal residues, halogen residues, and organic residues. If otherwise, it may be desired that the metal residue be contained in a range of preferably less than 100 ppb, and more preferably less than 10 ppb, per precursor. It may be desired that the metal residue be contained in a range of preferably less than 1 ppm, and more preferably 100 ppb, per total amount of the deposition material. When the tungsten-containing layer of inventive concepts is used in particular as a gate dielectric layer, an interlayer dielectric layer, a gate layer, and/or a barrier layer, it may be necessary for the deposition material to contain no alkali metal and alkali earth metal, or contain extremely small amount thereof if otherwise, that affects electrical characteristics of semiconductor devices. It may be desired that the halogen residue be contained in a range of preferably less than 100 ppm, more preferably less than 10 ppm, and even more preferably less than 1 ppm. It may be desired that the organic residue be contained in a range of less than 500 ppm, and preferably less than 50 ppm, per total amount of the deposition material. The deposition material may also be recommended to include no moisture. The moisture may cause occurrence of particles during the time when a CVD process is performed. To avoid the above problem, the moisture may be in advance removed from each precursor, the organic solvent, and the nucleophile. If the moisture is contained, it may be desired that each of the precursors, the organic solvent, and the nucleophile contain the moisture in a range of preferably less than 10 ppm, and more preferably less than 1 ppm.

The deposition material of inventive concepts may be requested to contain no particles. If otherwise, when a light-scattering automatic particle counter is used to detect particles contained in the deposition material in a liquid phase, it may be preferable that the number of particles larger than 0.3 µm be less than 100 per 1 ml of the liquid phase, and the number of particles larger than 0.2 µm be less than 1,000 per 1 ml of the liquid phase. It may be more preferable that the number of particles larger than 0.2 µm be less than 100 per 1 ml of the liquid phase.

A reaction gas may be introduced to react with the tungsten precursor in a deposition process using the tungsten precursor. The reaction gas may include an oxidizing gas such as oxygen, ozone, nitrogen dioxide, nitrogen monoxide, water vapor, hydrogen peroxide, acetic acid, and acetic anhydride. The reaction gas may include hydrogen that has reducing ability. In addition or alternatively, the reaction gas may include a nitriding gas such as mono(alkyl)amine, dialkylamine, trialkylamine, alkylenediamine, organic amine compound, hydrazine, and ammonia.

The tungsten-containing layer may be deposited on a substrate that includes glass, metal such as ruthenium, silicon, and/or ceramic such as silicon nitride, titanium nitride, tantalum nitride, titanium oxide, tantalum oxide, ruthenium oxide, zirconium oxide, hafnium oxide, and lanthanum oxide. The substrate may have a plate, spherical, fibrous, and/or squamous shape. The substrate may have a flat surface or may have thereon a three-dimensional structure such as trench.

The deposition process for forming the tungsten-containing layer may have essential process parameters such as reaction temperature (or substrate temperature), reaction pressure, deposition rate, etc. The reaction temperature may fall within a range of more than 100° C., or from 150 to 500° C., which is sufficient enough to react the tungsten precursor. The tungsten precursor of inventive concepts may have thermal stability at more than 300° C. Accordingly, a temperature range from 250 to 450° C. may be adequately selected as the reaction temperature. In the case of thermal CVD or photo CVD, the reaction pressure may fall within a range from 10 Pa to atmospheric pressure. In case of plasma CVD, the reaction pressure may fall within a range from 10 to 2,000 Pa. The deposition rate may be controlled based on material supply conditions (e.g., evaporation temperature, evaporation pressure), the reaction temperature, and the reaction pressure. A high deposition rate may deteriorate film quality of the tungsten-containing layer, while a low deposition rate may decrease productivity. The deposition rate may be controlled in a range either from 0.01 to 100 nm/min or from 1 to 50 nm/min.

The deposition process for forming the tungsten-containing layer may additionally have process parameters such as evaporation temperature and/or pressure of the deposition material. A temperature range from 0 to 150° C. may be given as the evaporation temperature of the deposition material in the deposition process using the tungsten precursors of inventive concepts. The evaporation pressure may fall within a range from 1 to 10,000 Pa.

When ALD is employed to form the tungsten-containing layer of inventive concepts, the ALD may include providing a deposition chamber with vapor of the tungsten precursor to allow a wafer to adsorb the tungsten precursor thereon, and then purging non-adsorbed vapor of the tungsten precursor. When the tungsten-containing layer further includes an element other than tungsten, the ADL process of the tungsten-containing layer may further include supplying vapor of other precursor containing the element or a reaction gas containing the element, allowing the adsorbed tungsten precursor on the wafer to react with the supplied vapor or reaction gas, and purging non-reacted vapor of other precursor or non-reacted reaction gas. The above process may decompose the tungsten precursor to combine the decomposed tungsten with the element, thereby forming a single atomic layered tungsten-containing layer on the wafer. In the ALD process, a thickness of the tungsten-containing layer may be determined by controlling the number of cycles each including the above steps.

For example, when the tungsten-containing layer is a tungsten oxide layer formed by ALD, the tungsten precursor of inventive concepts may be evaporated and an oxidizing gas may be prepared. An evaporation temperature or pressure may be the same as that discussed above. A temperature of the wafer (substrate) may fall with a range from room temperature to 500° C., more narrowly from 150 to 500° C., and even more narrowly from 150 to 350° C. The deposition chamber in which the ALD process is performed may have an inner pressure in a range from 1 to 10,000 Pa, and more narrowly from 10 to 1,000 Pa.

The purging step may use an inert gas such as nitrogen, helium, and argon, and/or the deposition chamber may be depressurized when the purging step is preformed. The deposition chamber may be depressurized to a range from 0.01 to 300 Pa, and more narrowly from 0.01 to 100 Pa.

The tungsten precursor of inventive concepts may have a good reactivity with oxidizing gases, nitriding gases, reducing gases, silicon precursors, or other metal precursors.

In the ALD process, energy originating from plasma, light, and/or voltage may be applied, and a catalyst may be optionally used. For example, the energy may be applied at the step of supplying the tungsten precursor of inventive concepts; at the steps of rising temperature, purging, and supplying oxidizing gas in the deposition process; or between the aforementioned steps.

After CVD or ALD is used to form the tungsten-containing layer of inventive concepts, an annealing process may be further performed on the tungsten-containing layer to enhance electrical characteristics of semiconductor devices. The annealing process may be carried out under inert gas, oxidizing gas, or reducing gas atmosphere. A reflow process may be further performed on the tungsten-containing layer such that a stepwise region may be filled with the tungsten-containing layer. In this case, the process temperature may fall within a range from 200 to 1,000° C., and more narrowly from 250 to 500° C.

The tungsten-containing layer of inventive concepts may be formed in CVD and/or ALD facilities. A heater may heat up a storage container that stores the tungsten precursor of inventive concepts, and thus vapor may be produced and supplied into the deposition chamber. Alternatively, a vaporizer may evaporate the tungsten precursor in a liquid phase stored in the storage container, and thus the evaporated tungsten precursor may be supplied into the deposition chamber. Dissimilarly, an RF matching system and an RF generator may be included in the CVD and/or ALD facilities such that the reaction gas may be plasma-treated. The tungsten-containing layer of inventive concepts may be formed in a single-wafer type manufacturing facility, and may also be formed in a batch type manufacturing facility such as furnace. For example, the batch type manufacturing facility may perform the deposition process on a plurality of wafers at the same time.

The tungsten-containing layer of inventive concepts may include a tungsten layer, a tungsten nitride layer, a tungsten oxide layer, a tungsten silicon layer, a tungsten carbide layer, etc. The tungsten-containing layer of inventive concepts may be used as a gate electrode of MOSFET, a gate dielectric layer, a mask layer, a source/drain contact, and/or a word line of memory devices.

Experimental Example: Manufacturing ALD Tungsten Oxide Layer

A deposition apparatus was loaded therein with a substrate on which a titanium nitride layer is formed. The substrate was controlled to a temperature of 250° C. The titanium nitride layer was provided thereon with a tungsten oxide layer as an example of the tungsten-containing layer of inventive concepts. The tungsten oxide layer was formed using an ALD method. A tungsten precursor expressed by Formula (1-3) was selected from the tungsten precursors of inventive concepts, and the selected tungsten precursor was used to form the tungsten oxide layer. Ozone ($O_3$) was supplied as a reaction gas. The tungsten precursor was evaporated at a temperature of 100° C. A single cycle was performed as follows: (1) a deposition step in which vapor produced by evaporation of the tungsten precursor was supplied into a deposition chamber for 10 seconds to deposit the tungsten precursor on a substrate; (2) a purge step in which an argon gas was used for 30 seconds to purge out non-reacted vapor of the tungsten precursor from the deposition chamber; (3) a reaction step in which ozone was supplied for 30 seconds to react with the tungsten precursor under pressure of 133 Pa; (4) a purge step in which an argon gas was used for 30 seconds to purge non-reacted ozone from the deposition chamber. The tungsten oxide ($WO_3$) layer was thus formed. The tungsten oxide layer increased in thickness of about 0.03 nm per one cycle. The cycle was repeated about 500 times to form the tungsten oxide layer having a total thickness of about 15 nm. The tungsten oxide layer contained carbon residues in a range of less than 0.1 wt %.

According to some example embodiments of inventive concepts, the tungsten precursor may exhibit high vapor pressure and may be changed into a liquid phase at room temperature or when being slightly heated up. After the tungsten precursor is evaporated, byproduct and/or residues may be produced in small quantity. The tungsten precursor of inventive concepts may be suitably used for a deposition process such as CVD or ALD, may be easily transported, and may be effortless controlled in its supply amount onto the substrate. Therefore, a high-quality tungsten-containing layer may be formed and productivity may be enhanced. Also, the tungsten precursor may include a relatively small number of halogen atoms to limit and/or prevent semiconductor devices from being deteriorated due to remaining halogen atoms after the process.

What is claimed is:

1. A tungsten precursor having a structure represented by Formula 1,

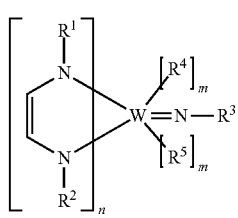

[Formula 1]

wherein, in Formula 1, $R^1$, $R^2$, and $R^3$ independently include a straight-chained or a branched alkyl group including a substituted or an unsubstituted C1-C5, $R^4$ and $R^5$ independently include a straight-chained or a branched alkyl group including a substituted or an unsubstituted C1-C5, a halogen element, a dialkylamino group including a substituted or an unsubstituted C2-C10, or a trialkylsilyl group including a substituted or an unsubstituted C3-C12, n is 1 or 2, m is 0 or 1, n+m=2, and when n is 2, m is 0 and each of $R^1$ and $R^2$ are provided in two, two $R^1$s being independently of each other, and two $R^2$s being independently of each other.

2. The tungsten precursor of claim 1, wherein at least one of $R^1$, $R^2$, $R^3$, $R^4$ and $R^5$ include a trialkylsilyl group including a C3-C12.

3. The tungsten precursor of claim 1, wherein at least one of $R^1$, $R^2$, $R^3$, $R^4$ and $R^5$ include one of a methyl, an ethyl, a propyl, an isopropyl, a butyl, an isobutyl, a secondary butyl, a tertiary butyl, a pentyl, or an isopentyl.

4. The tungsten precursor of claim 1, wherein at least one of $R^4$ and $R^5$ include one of fluorine, chlorine, bromine, or iodine.

5. The tungsten precursor of claim 1, wherein at least one of $R^4$ and $R^5$ include the dialkylamino group, and the dialkylamino group is one of a dimethylamino group, an ethylmethylamino group, a methylpropylamino group, a methylisopropylamino group, a diethylamino group, an ethylpropylamino group, an ethylisopropylamino group, a diisopropylamino group, a disecondarybutylamino group, and a ditertiarybutylamino group.

6. The tungsten precursor of claim 1, wherein at least one of $R^4$ and $R^5$ include the trialkylsilyl group, and the trialkylsilyl group is a trimethylsilyl group or a triethylsilyl group.

7. A tungsten precursor having a structure represented by Formula 1,

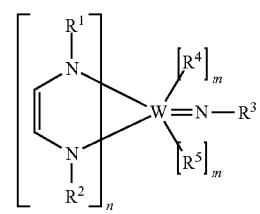

[Formula 1]

wherein, in Formula 1, n is 1, $R^1$, $R^2$, and $R^3$ independently are a straight-chained or a branched alkyl group including a substituted or an unsubstituted C3-C5, $R^4$ and $R^5$ independently include a straight-chained or a branched alkyl group including a substituted or an unsubstituted C1-C5, a halogen element, a dialkylamino group including a substituted or an unsubstituted C2-C10, or a trialkylsilyl group including a substituted or an unsubstituted C3-C12, m is 0 or 1, and n+m=2.

8. The tungsten precursor of claim 7, wherein $R^1$ and $R^2$ independently are a tertiary butyl group or a tertiary pentyl group, and $R^3$ is an isopropyl group, a tertiary butyl group, or a tertiary pentyl group.

9. The tungsten precursor of claim 7, wherein $R^4$ and $R^5$ independently are the straight-chained alkyl group including the substituted or the unsubstituted C1-C5.

10. The tungsten precursor of claim 9, wherein $R^4$ and $R^5$ independently are a methyl group or an ethyl group.

11. The tungsten precursor of claim 1, wherein, n is 2, and $R^1$, $R^2$, and $R^3$ independently are a straight-chained or a branched alkyl group including a substituted or an unsubstituted C3-C5.

12. The tungsten precursor of claim 11, wherein $R^1$, $R^2$, and $R^3$ independently are an isopropyl group, a secondary butyl group, or a tertiary butyl group.

13. The tungsten precursor of claim 1, wherein the structure of the tungsten precursor is represented by one of the following Formulae (1-1) to (1-75):

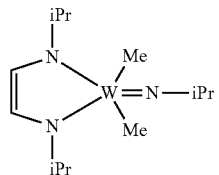
(1-1)

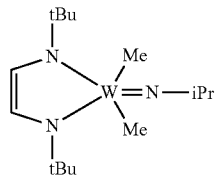
(1-2)

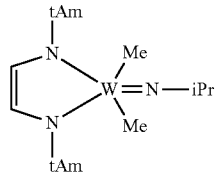
(1-3)

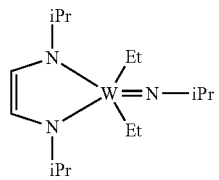
(1-4)

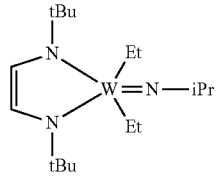
(1-5)

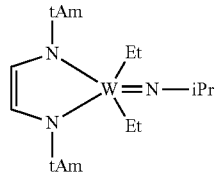
(1-6)

-continued

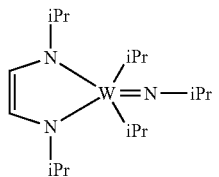
(1-7)

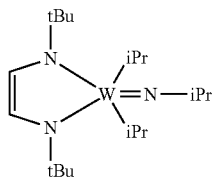
(1-8)

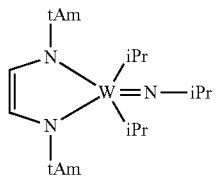
(1-9)

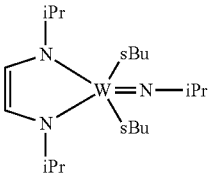
(1-10)

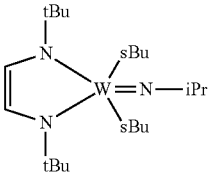
(1-11)

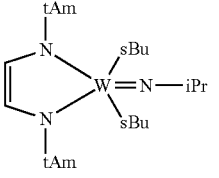
(1-12)

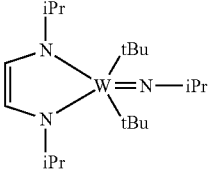
(1-13)

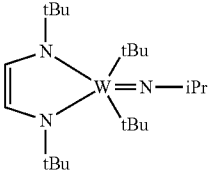
(1-14)

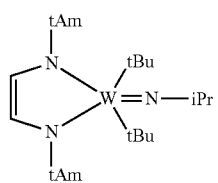
(1-15)
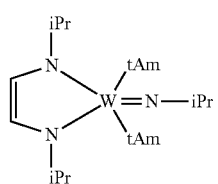
(1-16)
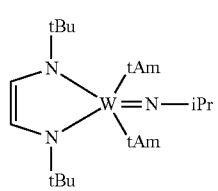
(1-17)
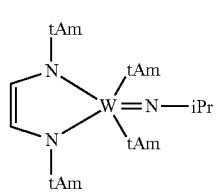
(1-18)
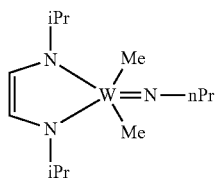
(1-19)
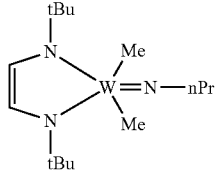
(1-20)
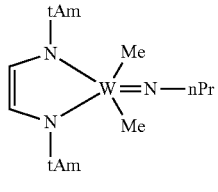
(1-21)
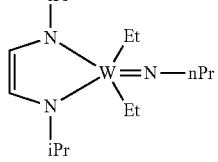
(1-22)
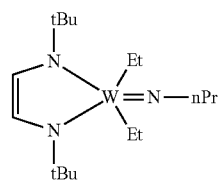
(1-23)
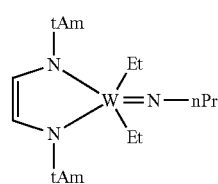
(1-24)
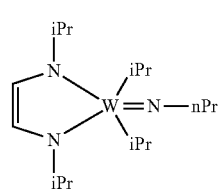
(1-25)
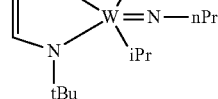
(1-26)
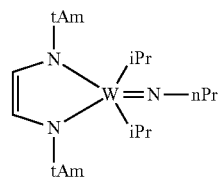
(1-27)
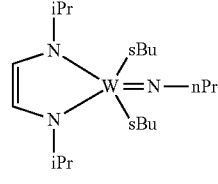
(1-28)
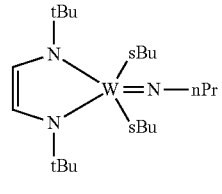
(1-29)
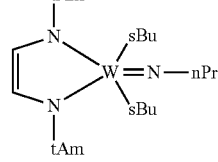
(1-30)

-continued
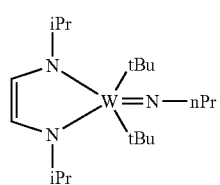
(1-31)
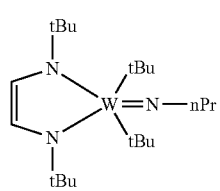
(1-32)
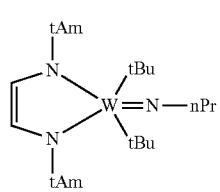
(1-33)
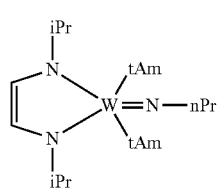
(1-34)
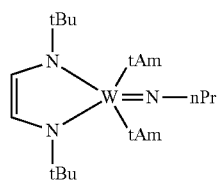
(1-35)
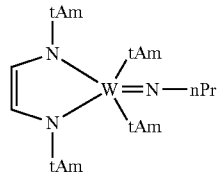
(1-36)
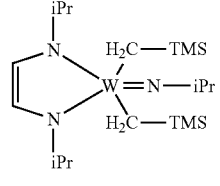
(1-37)
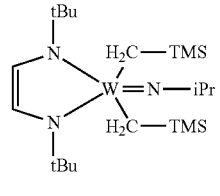
(1-38)
-continued
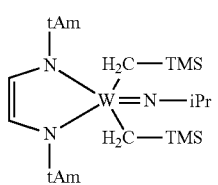
(1-39)
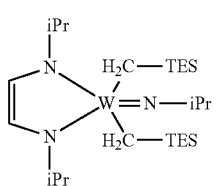
(1-40)
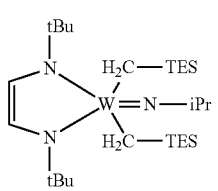
(1-41)
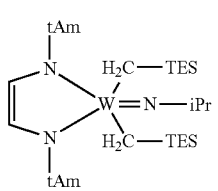
(1-42)
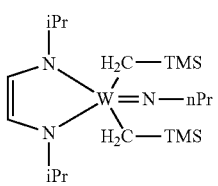
(1-43)
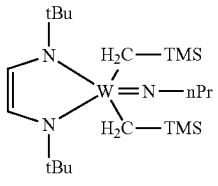
(1-44)
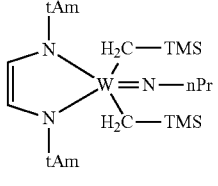
(1-45)
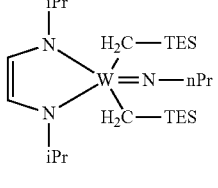
(1-46)

-continued
(1-47)
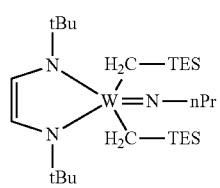
(1-48)
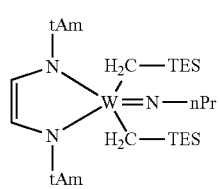
(1-49)
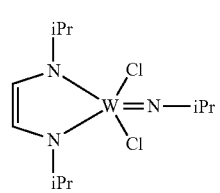
(1-50)
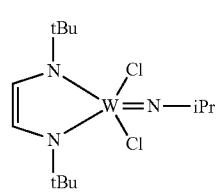
(1-51)
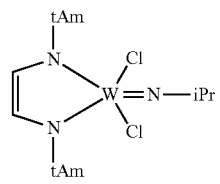
(1-52)
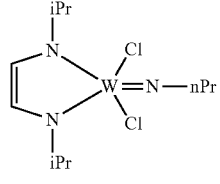
(1-53)
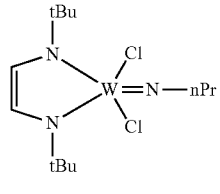
(1-54)
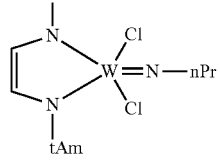
-continued
(1-55)
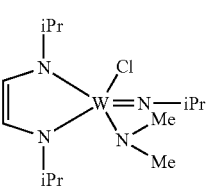
(1-56)
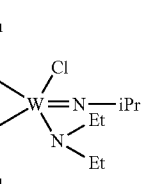
(1-57)
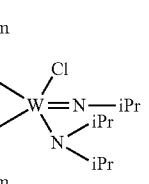
(1-58)
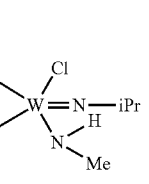
(1-59)
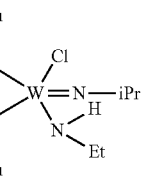
(1-60)
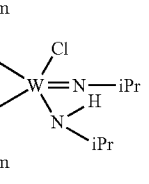
(1-61)
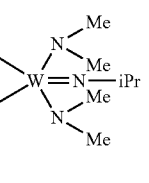
(1-62)
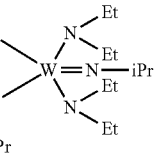

-continued (1-63)
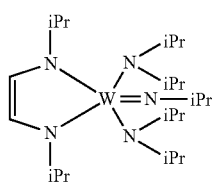

(1-64)
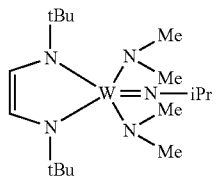

(1-65)
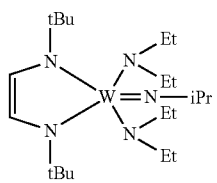

(1-66)
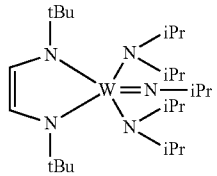

(1-67)
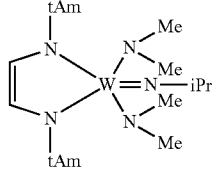

(1-68)
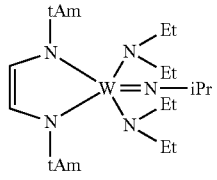

(1-69)
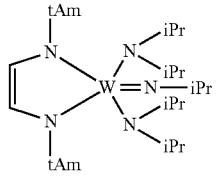

(1-70)
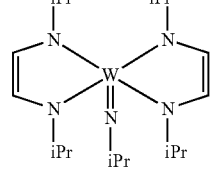

-continued (1-71)
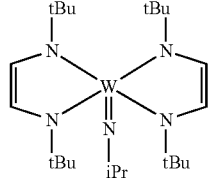

(1-72)
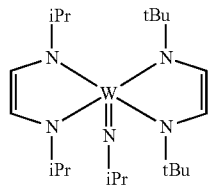

(1-73)
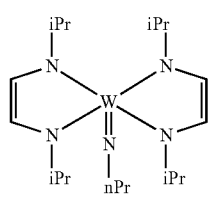

(1-74)
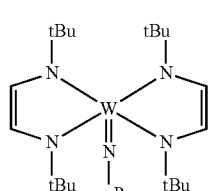

(1-75)
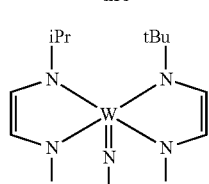

wherein, Me represents a methyl group, Et represents an ethyl group, nPr represents a normal propyl (n-propyl) group, iPr represents an isopropyl group, nBu represents a normal butyl (n-butyl) group, sBu represents a secondary butyl group, tBu represents a tertiary butyl group, tAm represents a tertiary amyl group, TMS represents a trimethylsilyl group, and TES represents a triethylsilyl group.

14. A method of forming a tungsten-containing layer, the method comprising:
providing a tungsten precursor on a substrate, the tungsten precursor having a structure represented by the following Formula 1,

[Formula 1]

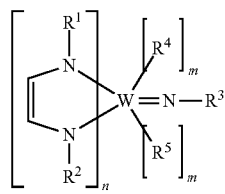

wherein, in Formula 1,
$R^1$, $R^2$, and $R^3$ independently include a straight-chained or a branched alkyl group including a substituted or unsubstituted C1-C5, R⁴ and R⁵ independently include a straight-chained or a branched alkyl group including a substituted or an unsubstituted C1-C5, a halogen element, a dialkylamino group including a substituted or an unsubstituted C2-C10, or a trialkylsilyl group including a substituted or an unsubstituted C3-C12, n is 1 or 2, m is 0 or 1, n+m=2, and when n is 2, m is 0 and each of R¹ and R² are provided in two, two R¹s being independently of each other, and two R²s being independently of each other.

15. The method of claim 14, wherein the providing the tungsten precursor includes providing the tungsten precursor using thermal CVD, plasma CVD, photo CVD, photoplasma CVD, ALD, or PEALD.

16. The method of claim 14, wherein the providing the tungsten precursor includes a CVD process, and the CVD process includes providing a vapor of the tungsten precursor along with a carrier gas.

17. The method of claim 14, wherein the providing the tungsten precursor includes a CVD process, and the CVD process includes forming a solution by dissolving the tungsten precursor in an organic solvent, and the CVD process further includes evaporating the solution.

18. The method of claim 14, wherein the providing the tungsten precursor includes an ALD process, the ALD process includes, providing a vapor of the tungsten precursor onto the substrate in a deposition chamber such that an adsorbed portion of the vapor of the tungsten precursor adsorbed onto the substrate, purging a non-adsorbed portion of the vapor of the tungsten precursor from the deposition chamber, providing a first reaction gas into the deposition chamber to react the adsorbed portion of the tungsten precursor and the first reaction gas with each other, and purging a non-reacted first reaction gas from the deposition chamber, and the first reaction gas includes one of oxygen, nitrogen, hydrogen, silicon or a metal.

19. The method of claim 18, further comprising:

providing a second reaction gas into the deposition chamber to react the adsorbed portion of the tungsten precursor and the second reaction gas with each other, the second reaction gas being different from the first reaction gas, and purging a non-reacted second reaction gas from the deposition chamber, wherein the second reaction gas includes one of oxygen, nitrogen, hydrogen, silicon or a metal.

20. The method of claim 18, wherein the first reaction gas is one of oxygen, ozone, nitrogen dioxide, nitrogen monoxide, water vapor, hydrogen peroxide, acetic acid, or acetic anhydride, the first reaction gas is one of mono(alkyl)amine, dialkylamine, trialkylamine, alkylenediamine, organic amine compound, hydrazine, or ammonia, or the first reaction gas is hydrogen.

* * * * *